US012230987B2

(12) United States Patent
Sun et al.

(10) Patent No.: US 12,230,987 B2
(45) Date of Patent: *Feb. 18, 2025

(54) POWER CONVERSION DEVICE

(71) Applicant: CONTEMPORARY AMPEREX TECHNOLOGY (HONG KONG) LIMITED, Hong Kong (CN)

(72) Inventors: Weiping Sun, Ningde (CN); Zhimin Dan, Ningde (CN); Zhanliang Li, Ningde (CN); Shuyun Xiong, Ningde (CN); Yu Yan, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 693 days.

This patent is subject to a terminal disclaimer.

(21) Appl. No.: 17/459,220

(22) Filed: Aug. 27, 2021

(65) Prior Publication Data
US 2022/0239127 A1 Jul. 28, 2022

Related U.S. Application Data

(63) Continuation of application No. PCT/CN2021/074196, filed on Jan. 28, 2021.

(51) Int. Cl.
*H02J 7/00* (2006.01)
*B60L 58/12* (2019.01)
*G01R 31/382* (2019.01)

(52) U.S. Cl.
CPC ............ *H02J 7/0047* (2013.01); *B60L 58/12* (2019.02); *G01R 31/382* (2019.01)

(58) Field of Classification Search
CPC .................................................. H02J 7/0047
(Continued)

(56) References Cited

U.S. PATENT DOCUMENTS 10,351,004 B1 7/2019 Pastor et al.
2013/0113430 A1* 5/2013 Kim ...................... H02J 7/0032
320/136

(Continued)

FOREIGN PATENT DOCUMENTS

CN 103825458 A 5/2014
CN 104836273 A 8/2015

(Continued)

OTHER PUBLICATIONS

Notification to Grant Patent Right for Invention dated Nov. 10, 2023 received in Chinese Patent Application No. CN 202180041724.9.

*Primary Examiner* — Yalkew Fantu
(74) *Attorney, Agent, or Firm* — Scully, Scott, Murphy & Presser, P.C.

(57) ABSTRACT

Embodiments of the present application provides a method for pre-charging a power conversion device and a power conversion device. The power conversion device is configured to perform power conversion between a charging pile and a traction battery, and the method includes: receiving, by the power conversion device, a first message sent by a battery management system of the traction battery, and the first message is configured to indicate that the battery management system is ready for charging; performing, by the power conversion device, a pre-charging, and the pre-charging includes: charging a capacitor in the power conversion device; and forwarding, by the power conversion device, the first message to the charging pile after the pre-charging is completed. The technical solution of the embodiments of the present application can ensure a normal charging process.

19 Claims, 6 Drawing Sheets

(58) Field of Classification Search
USPC .......................................................... 320/134
See application file for complete search history.

(56) References Cited

U.S. PATENT DOCUMENTS

| | | |
|---|---|---|
| 2015/0072176 A1 | 3/2015 | Dinkelman et al. |
| 2015/0274024 A1 | 10/2015 | Da Costa et al. |
| 2018/0072180 A1* | 3/2018 | Wu ....................... H02J 7/0049 |
| 2019/0202300 A1* | 7/2019 | Pastor ....................... H02J 7/04 |
| 2020/0062138 A1 | 2/2020 | Smolenaers |
| 2020/0122584 A1* | 4/2020 | Zhang ................... B60W 10/30 |
| 2020/0127267 A1 | 4/2020 | Dulle et al. |
| 2020/0164755 A1 | 5/2020 | Smolenaers |
| 2021/0155101 A1 | 5/2021 | Pfeilschifter et al. |
| 2022/0239120 A1* | 7/2022 | Sun ..................... H02J 7/00032 |
| 2023/0070522 A1* | 3/2023 | Xiong ..................... B60L 53/20 |

FOREIGN PATENT DOCUMENTS

| | | |
|---|---|---|
| CN | 105680541 A | 6/2016 |
| CN | 104578291 B | 2/2017 |
| CN | 109878372 A | 6/2019 |
| CN | 110370962 A | 10/2019 |
| CN | 110481381 A | 11/2019 |
| CN | 110979080 A | 4/2020 |
| CN | 111806365 A | 10/2020 |
| CN | 111959332 A | 11/2020 |
| DE | 102018121405 A1 | 3/2020 |
| JP | H10304501 A | 11/1998 |
| KR | 20200125983 A | 11/2020 |

\* cited by examiner

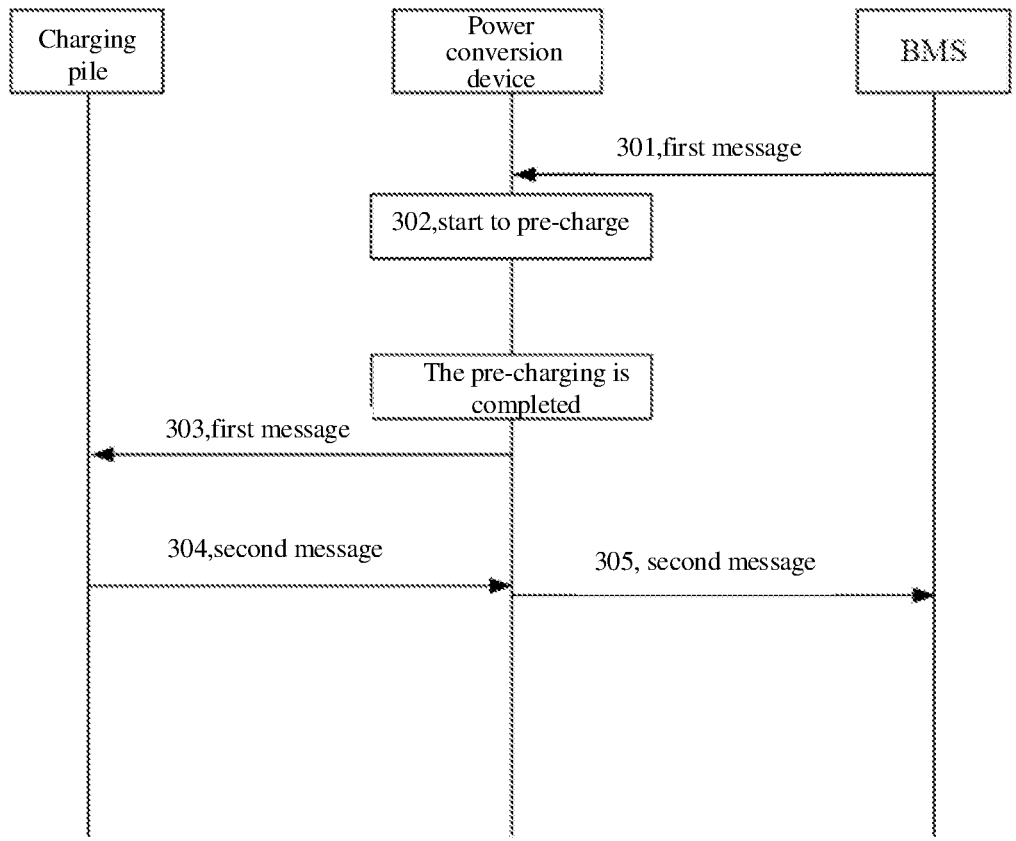

POWER CONVERSION DEVICE

CROSS-REFERENCE TO RELATED APPLICATIONS

This application is a continuation of International Application No. PCT/CN2021/074196, filed on Jan. 28, 2021, the disclosure of which is hereby incorporated by reference in its entirety.

TECHNICAL FIELD

The present application relates to the field of battery technologies, and in particular, to a method for pre-charging a power conversion device and the power conversion device.

BACKGROUND

Electric vehicles have become an important part of the sustainable development of automotive industry due to their advantages of energy saving and environmental protection. For the electric vehicles, battery technology is also an important factor for their development. In the battery technology, how to ensure a normal charging process is a technical problem to be solved.

SUMMARY

The present application provides a method for pre-charging a power conversion device and the power conversion device, which can ensure a normal charging process.

In a first aspect, a method for pre-charging a power conversion device is provided, the power conversion device is configured to perform power conversion between a charging pile and a traction battery, and the method includes: receiving, by the power conversion device, a first message sent by a battery management system of the traction battery, and the first message is configured to indicate that the battery management system is ready for charging; performing, by the power conversion device, a pre-charging, and the pre-charging includes: charging a capacitor in the power conversion device; and forwarding, by the power conversion device, the first message to the charging pile after the pre-charging is completed.

In embodiments of the present application, the power conversion device forwards charging readiness message of the BMS to the charging pile after the pre-charging is completed, which can prevent the charging pile from outputting a high voltage when the pre-charging of the power conversion device is not completed, so as to ensure the normal charging process and charging safety.

In a possible implementation manner, the method further includes: receiving, by the power conversion device, a second message sent by the charging pile, and the second message is configured to indicate that the charging pile is ready for charging; and forwarding, by the power conversion device, the second message to the battery management system.

In a possible implementation manner, performing, by the power conversion device, the pre-charging, including: when the power conversion device determines that the power conversion device is in a normal state, the pre-charging is performed.

In a possible implementation manner, the method further includes: detecting, by the power conversion device, a state of the power conversion device during a pre-charging process, and under the condition that a state of the power conversion device is in an abnormal pre-charging state, performing, by the power conversion device, an abnormal processing.

In a possible implementation manner, the method further includes: ending, by the power conversion device, the pre-charging after determining that the pre-charging is completed.

In a second aspect, a method for pre-charging a power conversion device is provided, the power conversion device is configured to perform power conversion between a charging pile and a traction battery, the power conversion device includes: a control unit and a power unit, and the method includes: sending, by the control unit, a pre-charging instruction to the power unit when the power unit is in a normal state; starting, by the power unit, to pre-charge according to the pre-charging instruction, and the pre-charging includes: charging a capacitor in the power conversion device.

In the embodiments of the present application, the control unit controls the power unit to perform the pre-charging according to the state of the power unit, so as to charge the capacitor in the power conversion device. In this way, the capacitor will no longer cause a large pulsed current in a subsequent charging process of the traction battery, which can ensure the normal charging progress and the charging safety.

In a possible implementation manner, the method further includes: sending, by the control unit, an invalid pre-charging instruction to the power unit before sending the pre-charging instruction to the power unit; sending, by the power unit, a first state message to the control unit in response to the invalid pre-charging instruction, and carrying, by the first state message, a state of the power unit; and determining, by the control unit, the state of the power unit according to the first state message.

In a possible implementation manner, the method further includes: detecting, by the power unit, a state of the power unit, and sending, a second state message to the control unit after starting the pre-charging, and carrying, by the second state message, the state of the power unit.

In a possible implementation manner, the method further includes: the control unit performs an abnormal processing when the power unit is in an abnormal pre-charging state.

In a possible implementation manner, the method further includes: sending, by the power unit, a pre-charging completion message to the control unit after the pre-charging is completed; and sending, by the control unit, an end pre-charging instruction to the power unit according to the pre-charging completion message.

In a possible implementation manner, before the control unit sends the pre-charging instruction to the power unit, the method further includes: receiving, by the control unit, a first message sent by a battery management system of the traction battery, and the first message is configured to indicate that the battery management system is ready for charging.

In a possible implementation manner, the method further includes: forwarding, the control unit, the first message to the charging pile after the pre-charging is completed; receiving, by the control unit, a second message sent by the charging pile, and the second message is configured to indicate that the charging pile is ready for charging; and forwarding, by the control unit, the second message to the battery management system.

In the embodiments of the present application, the control unit then forwards charging readiness message of BMS to the charging pile after the pre-charging is completed, which can prevent the charging pile from outputting a high voltage when the pre-charging of the power conversion device is not completed, so as to ensure the normal charging process and the charging safety.

In a possible implementation manner, the method further includes: forwarding, by the control unit, the first message to the charging pile; receiving, by the control unit, a second message sent by the charging pile, and the second message is configured to indicate that the charging pile is ready for charging; and under the condition that the pre-charging is not completed, sending, by the control unit, a suspend output message to the charging pile, and the suspend output message is configured to indicate that the charging pile suspends outputting charging power.

In the embodiments of the present application, when the pre-charging of the power conversion device has not been completed, the control unit causes the charging pile to suspend outputting by sending the suspend output message to the charging pile, in order to avoid the high voltage output from the charging pile causing the capacitor in the power conversion equipment to produce the large pulsed current, so as to ensure the normal charging progress and the charging safety.

In a possible implementation manner, the method further includes: forwarding, by the control unit, the first message to the charging pile; receiving, by the control unit, a second message sent by the charging pile, and the second message is configured to indicate that the charging pile is ready for charging; and under the condition that the pre-charging is not completed, sending, by the control unit, a charging demand message to the charging pile, carrying, by the charging demand message, a demand current value, and the demand current value is a minimum value of a demand current.

In the embodiments of the present application, when the pre-charging of the power conversion device has not been completed, the control unit causes the charging pile to output the current according to the minimum value of the demand current by sending the minimum value of the demand current to the charging pile, in order to avoid a high current output from the charging pile causing the capacitor in the power conversion device to produce the large pulsed current, so as to ensure the normal charging process and the charging safety.

In a third aspect, a power conversion device is provided, the power conversion device is configured to perform power conversion between a charging pile and a traction battery, and the power conversion device includes: a receiving module configured to receive a first message sent by a battery management system of the traction battery, and the first message is configured to indicate that the battery management system is ready for charging; a processing module configured to perform pre-charging, and the pre-charging includes: charging a capacitor in the power conversion device; and a sending module configured to forward the first message to the charging pile after the pre-charging is completed.

In a possible implementation manner, the receiving module is further configured to receive a second message sent by the charging pile, and the second message is configured to indicate that the charging pile is ready for charging; and the sending module is further configured to forward the second message to the battery management system.

In a possible implementation manner, the processing module is configured to perform the pre-charging when determining that the power conversion device is in a normal state.

In a possible implementation manner, the processing module is configured to detect a state of the power conversion device during a pre-charging process, and under the condition that the state of the power conversion device is in an abnormal pre-charging state, an abnormal processing is performed.

In a possible implementation manner, the processing module is configure to end the pre-charging after determining that the pre-charging is completed.

In a fourth aspect, a power conversion device is provided, the power conversion device is configured to perform power conversion between a charging pile and a traction battery, the power conversion device includes: a control unit and a power unit; the control unit is configured to send a pre-charging instruction to the power unit when the power unit is in a normal state; the power unit is configured to start to pre-charge according to the pre-charging instruction, and the pre-charging includes: charging a capacitor in the power conversion device.

In a possible implementation manner, the control unit is further configured to send an invalid pre-charging instruction to the power unit before sending the pre-charging instruction to the power unit; the power unit is further configured to send a first state message to the control unit in response to the invalid pre-charging instruction, and the first state message carries a state of the power unit; and the control unit is further configured to determine the state of the power unit according to the first state message.

In a possible implementation manner, the power unit is further configured to detect a state of the power unit and send a second state message to the control unit after starting the pre-charging, and the second state message carries the state of the power unit.

In a possible implementation manner, the control unit is further configured to perform an abnormal processing when the power unit is in an abnormal pre-charging state.

In a possible implementation manner, the power unit is further configure to send a pre-charging completion message to the control unit after the pre-charging is completed; and the control unit is further configured to send an end pre-charging instruction to the power unit according to the pre-charging completion message.

In a possible implementation manner, the control unit is further configured to, before the pre-charging instruction is sent to the power unit, receive a first message sent by a battery management system of the traction battery, and the first message is configured to indicate that the battery management system is ready for charging.

In a possible implementation manner, the control unit is further configured to forward the first message to the charging pile after the pre-charging is completed; receive a second message sent by the charging pile, and the second message is configured to indicate that the charging pile is ready for charging; and forward the second message to the battery management system.

In a possible implementation manner, the control unit is further configured to forward the first message to the charging pile; receive a second message sent by the charging pile, and the second message is configured to indicate that the charging pile is ready for charging; and under the condition that the pre-charging is not completed, send a suspend output message to the charging pile, and the suspend output message is configured to indicate that the charging pile suspends outputting charging power.

In a possible implementation manner, the control unit is further configured to forward the first message to the charging pile; receive a second message sent by the charging pile, and the second message is configured to indicate that the charging pile is ready for charging; and under the condition that the pre-charging is not completed, send a charging demand message to the charging pile, the charging demand message carries a demand current value, and the demand current value is a minimum value of a demand current.

In a fifth aspect, a power conversion device is provided, including a memory and a processor, where the memory is configured to store an instruction, and the processor is configured to read the instruction and perform, based on the instruction, the method according to the first aspect and any possible implementation of the first aspect described above, or the method according to the second aspect and any possible implementation of the second aspect described above.

In a sixth aspect, a readable storage medium is provided, where the readable storage medium is configured to store a computer program used to perform the method according to the first aspect and any possible implementation of the first aspect described above, or the method according to the second aspect and any possible implementation of the second aspect described above.

BRIEF DESCRIPTION OF DRAWINGS

To describe technical solutions in embodiments of the present application more clearly, the following briefly introduces accompanying drawings required for describing the embodiments of the present application. Apparently, the accompanying drawings in the following description show merely some embodiments of the present application, and a person of ordinary skill in the art may still derive other drawings from these accompanying drawings without creative efforts.

FIG. 3 is an interaction flowchart of a method for pre-charging according to an embodiment of the present application;

FIG. 4 is a schematic flowchart of a method for pre-charging a power conversion device according to another embodiment of the present application;

DESCRIPTION OF EMBODIMENTS

Figures 1, 2:
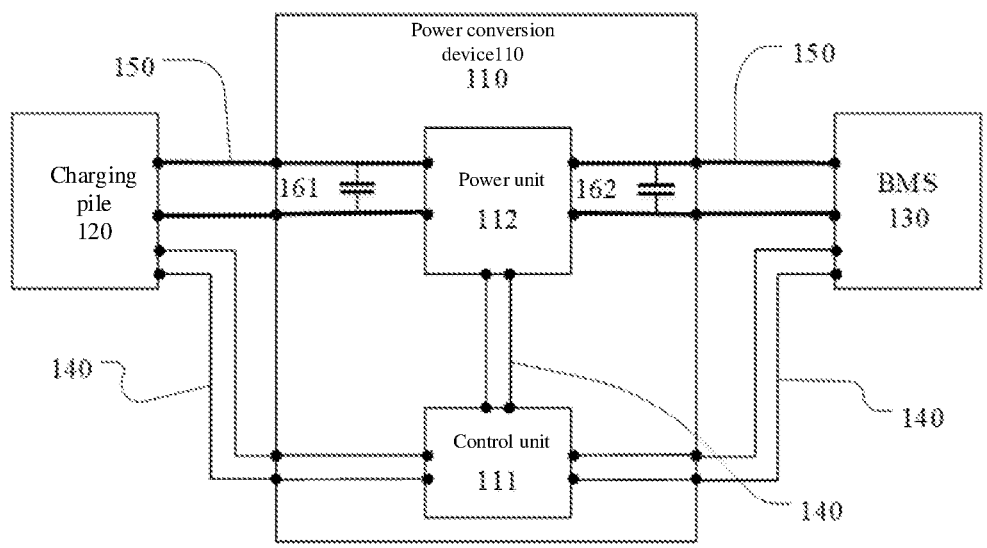
FIG. 1 is a schematic diagram of an application architecture of a power conversion device according to an embodiment of the present application.
FIG. 2 is a schematic flowchart of a method for pre-charging a power conversion device according to an embodiment of the present application.

The following describes implementations of the present application in detail with reference to accompany drawings and embodiments. The detailed description of the following embodiments and the accompanying drawings are used to examplarily illustrate principles of the present application, but cannot be used to limit the scope of the present application, that is, the present application is not limited to the described embodiments.

In the description of the present application, it should be noted that unless otherwise provided, all technical and scientific terms used in the present application have the same meanings as those commonly understood by those skilled in the art to which the present application belongs. The terms used in the specification of the present application are merely for the purpose of describing specific embodiments, but are not intended to limit the present application. The terms "comprising" and "having" and any variations thereof in the specification and the claims of the present application as well as the foregoing description of the accompanying drawings are intended to cover non-exclusive inclusions. The terms "first", "second" and the like in the specification and the claims of the present application as well as the above drawings are used to distinguish different objects, rather than to describe a specific order or primary-secondary relationship.

The phrase "embodiments" referred to in the present application means that the descriptions of specific features, structures, and characteristics in combination with the embodiments are included in at least one embodiment of the present application. The phrase at various locations in the specification does not necessarily refer to the same embodiment, or an independent or alternative embodiment exclusive of another embodiment. Those skilled in the art understand, in explicit and implicit manners, that an embodiment described in the present application may be combined with another embodiment.

In the description of the present application, it should also be noted that unless otherwise explicitly specified and defined, the terms "mounting", "connecting", "connection" and "attaching" should be understood in a broad sense, for example, they may be a fixed connection, a detachable connection, or an integrated connection; may be a direct connection and may also be an indirect connection via an intermediate medium, or may be communication between the interiors of two elements. Those of ordinary skill in the art can appreciate the specific meanings of the foregoing terms in the present application according to specific conditions.

A traction battery is the battery that provides power source for an electric device. Optionally, the traction battery may be a power battery. In terms of battery types, the traction battery may be a lithium-ion battery, a lithium metal battery, a lead-acid battery, a nickel separator battery, a nickel hydrogen battery, a lithium-sulfur battery, a lithium-air battery or a sodium-ion battery, which is not specifically limited in the embodiments of the present application. In terms of battery size, the traction battery in the embodiments of the application may be a cell/battery cell, a battery module or a battery pack, which is not specifically limited in the embodiments of the present application. Optionally, the power consumption device may be a vehicle, a ship or a spacecraft, which is not limited in the embodiments of the present application. Battery Management System (BMS) of the traction battery is a control system to protect safety of the traction battery, which performs charge and discharge management, high voltage control, battery protection, battery data collection, battery status evaluation and other functions.

A charging pile, also known as a charger, is a device that charges the traction battery. The charging pile may output charging power according to charging needs of the BMS so as to charge the traction battery. For example, the charging pile may output voltage and current according to a demand voltage and demand current sent by the BMS.

However, in some special scenarios, a range of the voltage and current that the charging pile can output cannot match the traction battery. For example, in a low temperature scenario, a minimum voltage or current that the charging pile can output may also cause lithium evolution during a charging process, and the traction battery cannot be charged normally. In addition, in some cases, a power form conversion may also be required to be performed between the charging pile and the traction battery, such as: voltage change, current change, power state change, timing change of the current, voltage, and power, etc.

For the above situation, the embodiment of the application provides a power conversion device, where the power conversion device may perform power conversion between the charging pile and the traction battery. When there is a need for performing the power conversion between the charging pile and the traction battery, the power conversion device converts power types output by the charging pile into the power types required by the traction battery. For example, the power conversion device can convert DC power output by the charging pile into pulse power, or change a voltage value, change a current value, or change the timing of the voltage and current, etc.

There is a large-capacity capacitor in a high-voltage circuit of the power conversion device. At the moment of starting the power conversion device, high voltage in a charging high-voltage circuit may charge the large-capacity capacitor in the power conversion device, generating a large pulsed current. The large pulsed current may damage components in the power conversion device or traction battery, such as a high-voltage contractor.

In view of this, the present application provides a method for pre-charging the power conversion device. By pre-charging the capacitor in the power conversion device, it is possible to prevent the large pulsed current caused by the capacitor in the power conversion device from damaging the components in a charging circuit, which ensures a normal charging process and charging safety.

It should be understood that the "pre-charging" may also be referred to as "priming", which is not limited in the embodiments of the present application.

FIG. 1 is a schematic diagram of an application architecture of a power conversion device according to the embodiments of the present application. As shown in FIG. 1, a power conversion device 110 is arranged between a charging pile 120 and a BMS of a traction battery, that is, the power conversion device 110 is connected to the charging pile 120 and BMS 130 respectively, and the charging pile 120 is not directly connected to the BMS 130.

In the case of not providing the power conversion device 110, when charging the traction battery, the charging pile 120 is directly connected to the BMS 130, and then a charging process is started to charge the traction battery. As mentioned above, in some cases, the charging pile 120 may not be able to directly charge the traction battery normally. Therefore, in the embodiments of the present application, the power conversion device 110 is added to perform power conversion between the charging pile 120 and the traction battery.

Optionally, the power conversion device 110 may include a control unit 111 and a power unit 112. The control unit 111 is responsible for detecting states of the charging pile 120 and BMS 130 during the charging process; the control unit 111 is connected to the charging pile 120 and BMS 130 respectively through a communication line 140 so as to exchange information with the charging pile 120 and BMS 130 respectively. In addition, the control unit 111 is also connected to the power unit 112 through the communication line 140 so as to exchange the information with the power unit 112 and control the power unit 112 to perform the power conversion. For example, the communication line 140 may be a communication line of Controller Area Network (CAN).

The power unit 112 is responsible for converting power types output by the charging pile 120 into the power types required by the traction battery according to instructions of the control unit 111. The power unit 112 is connected to the control unit 111 through the communication line 140 to exchange the information. A communication protocol may be configured between the control unit 111 and the power unit 112, for example, to define syntax, semantics and the timing of communication, so as to ensure a normal interaction between the control unit 111 and the power unit 112.

A control strategy may be configured on the control unit 111. For example, the control unit 111 determines a state of the current charging process by analyzing charging messages of the charging pile 120 and BMS 130, so as to control the power unit 112 to perform corresponding operations. For example, when a pre-charging condition is satisfied, the power unit 112 is controlled to perform a pre-charging operation. Simultaneously, the control unit 111 communicates with the power unit 112 to obtain a state of the power unit 112 so as to perform corresponding operations. For example, when the power unit 112 reports a fault, the control unit 111 sends a command to stop the pre-charging in time.

The power unit 112 is connected to the charging pile 120 and BMS 130 respectively through a high voltage line 150, in order to convert the charging power output by the charging pile 120 through the high voltage line 150 and then output it to the BMS so as to charge the traction battery.

There is a large-capacity capacitor in the power conversion device 110, such as, a first capacitor 161 and a second capacitor 162. As mentioned above, the capacitor in the power conversion device 110 may cause the large pulsed current to damage the components in the charging circuit. The embodiments of the present application provides a pre-charging solution for the power conversion device 110 to solve the above mentioned problem.

FIG. 2 shows a schematic flowchart of a method 200 for pre-charging a power conversion device according to an embodiment of the present application. The power conversion device is configured to perform the power conversion between the charging pile and the traction battery. For example, the power conversion device can be the power conversion device 110 in FIG. 1.

210, receiving, by the power conversion device, a first message sent by a battery management system of the traction battery, and the first message is configured to indicate that the battery management system is ready for charging.

After the charging process is started, the charging pile and BMS first prepare for charging. During this period, the power conversion device forwards the message between the charging pile and BMS without changing message content. After the BMS is ready, the BMS sends the first message indicating that the BMS is ready for charging. Since the power conversion device is arranged between the charging pile and BMS, the first message reaches the power conversion device first.

220, performing, by the power conversion device, a pre-charging, and the pre-charging includes: charging a capacitor in the power conversion device.

The power conversion device starts to pre-charge after receiving the first message. At this time, the BMS is ready, so the power conversion device can use voltage of the traction battery to charge the capacitor in the power conversion device.

230, forwarding, by the power conversion device, the first message to the charging pile after the pre-charging is completed.

After the pre-charging is completed, a normal charging can be performed. At this time, a charging readiness message of the BMS can be sent to the charging pile so as to enable the charging pile to prepare for charging.

The charging pile also performs the pre-charging after receiving the charging readiness message of the BMS, that is, the voltage of the traction battery is used to charge the capacitor in the charging pile. A pre-charging process of the power conversion device may last a long time, that is, if the power conversion device and the charging pile start to pre-charge at the same time, the charging pile may complete charging preparation before the pre-charging of the power conversion device is completed. If the charging pile outputs the high voltage at this time, it may still cause the capacitor in the power conversion device to produce the large pulsed large current, which affects the normal charging process.

In the embodiments of the present application, the power conversion device then forwards the charging readiness message of the BMS to the charging pile after the pre-charging is completed, which can prevent the charging pile from outputting the high voltage when the pre-charging of the power conversion device is not completed, so as to ensure the normal charging process and the charging safety.

In this embodiment, the power conversion device performs the pre-charging first, and then the charging pile performs the pre-charging after the pre-charging of the power conversion device is completed, that is, the power conversion device and the charging pile perform the pre-charging one after another.

FIG. 3 shows an interaction flowchart of a method for pre-charging according to an embodiment of the present application. The power conversion device, the charging pile and the BMS in the FIG. 3 can be the power conversion device 110, the charging pile 120 and the BMS 130 in FIG. 1.

301, the BMS sends the first message.

The BMS sends the first message that the charging is ready to the charging pile after it is ready, in order to let the charging pile confirm that the BMS is ready for charging. The first message of the BMS is first sent to the power conversion device.

302, the power conversion device starts to pre-charge.

The power conversion device starts to pre-charge after receiving the first message.

303, the power conversion device forwards the first message to the charging pile after the pre-charging is completed.

304, the charging pile sends a second message.

The charging pile performs the charging preparation after receiving the first message, for example, to perform the pre-charging, and determine whether an output voltage is in a normal range, and so on. The charging pile sends the second message indicating that the charging pile is ready after it is ready, in order to let the BMS confirm that the charging pile is ready for outputting. The second message of the charging pile is first sent to the power conversion device.

305, the power conversion device forwards the second message to the BMS.

Since the power conversion device has completed the pre-charging, that is, it can be charged normally, the power conversion device forwards the second message to the BMS after receiving the second message sent by the charging pile. In this way, the BMS and charging pile can continue the subsequent charging process.

In the embodiments of the present application, the power conversion device and charging pile perform the pre-charging one after another. In this way, the charging pile can output the high voltage after the pre-charging of the power conversion device is completed, so as to ensure the normal charging process and the charging safety.

In the above mentioned embodiments, the power conversion device and the charging pile perform the pre-charging one after another. Optionally, the power conversion device and the charging pile can also perform the pre-charging simultaneously. The solution will be described hereinafter.

FIG. 4 shows a schematic flowchart of a method 400 for pre-charging a power conversion device according to another embodiment of the present application. The power conversion device is configured to perform the power conversion between the charging pile and the traction battery. For example, the power conversion device can be the power conversion device 110 in FIG. 1.

410, receiving, by the power conversion device, the first message sent by the battery management system of the traction battery, and the first message is configured to indicate that the battery management system is ready for charging.

After the charging process is started, the charging pile and BMS first prepare for charging. During this period, the power conversion device forwards the message between the charging pile and BMS without changing the message content. After the BMS is ready, the BMS sends the first message indicating that the BMS is ready for charging. Since the power conversion device is arranged between the charging pile and BMS, the first message reaches the power conversion device first.

420, forwarding, by the power conversion device, the first message to the charging pile and performs the pre-charging, and the pre-charging includes: charging the capacitor in the power conversion device.

The power conversion device does not change the message content after receiving the first message, and forwards the first message to the charging pile. Simultaneously, the power conversion device performs the pre-charging. At this time, the BMS is ready, so the power conversion device can use the voltage of the traction battery to charge the capacitor in the power conversion device. Since the power conversion device has sent the charging readiness message of the BMS to the charging pile simultaneously, the charging pile can also perform the pre-charging at the same time, that is, the voltage of the traction battery is used to charge the capacitor in the charging pile. In this case, the power conversion device and charging pile perform the pre-charging simultaneously.

In the embodiments of the present application, the power conversion device charges the capacitor in the power conversion device after receiving the charging readiness message of the BMS. In this way, the capacitor will not cause the large pulsed current in the subsequent charging process of the traction battery, which can ensure the normal charging progress and the charging safety.

Figure 5:
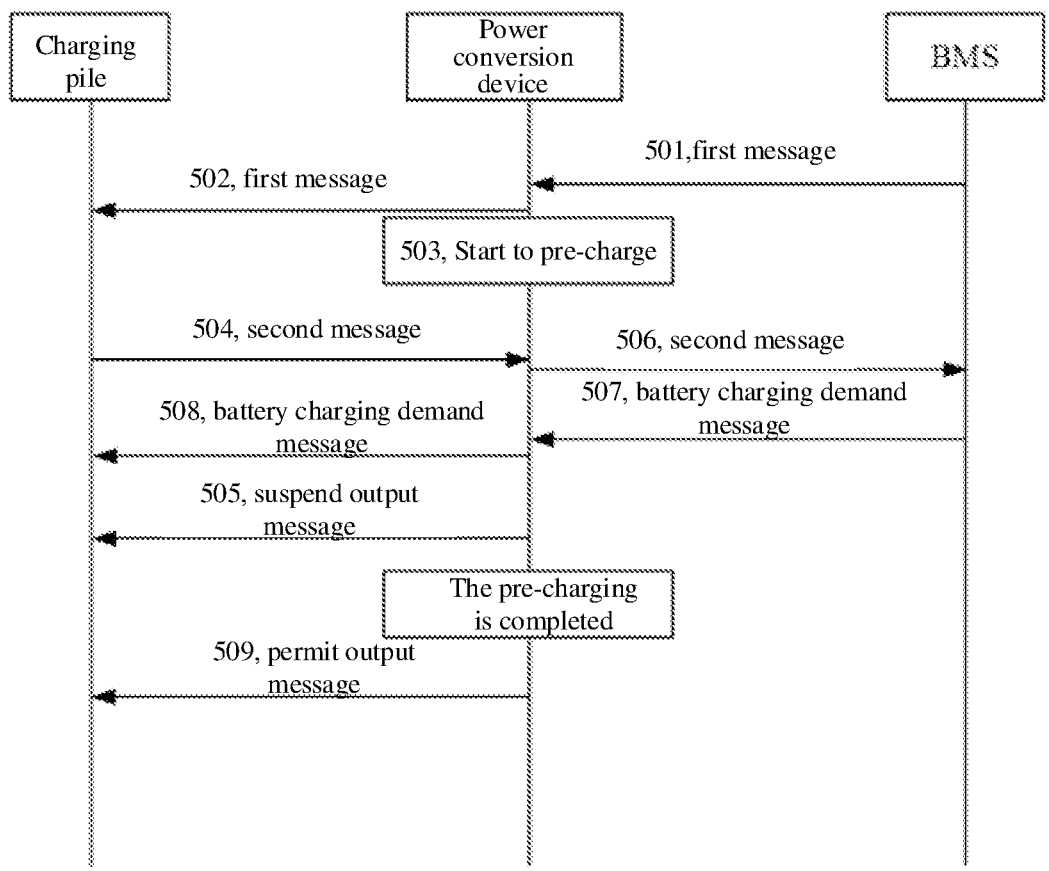
FIG. 5 is an interaction flowchart of a method for pre-charging according to another embodiment of the present application.

FIG. 5 shows an interaction flowchart of a method for pre-charging according to another embodiment of the present application. The power conversion device, the charging pile and the BMS in the FIG. 5 can be the power conversion device 110, the charging pile 120 and the BMS 130 in FIG. 1.

501, the BMS sends the first message.

The BMS sends the first message that the charging is ready to the charging pile after it is ready, in order to let the charging pile confirm that the BMS is ready for charging. The first message of the BMS is first sent to the power conversion device.

502, the power conversion device forwards the first message to the charging pile.

503, the power conversion device starts to pre-charge.

The power conversion device starts to pre-charge while forwarding the first message to the charging pile.

504, the charging pile sends the second message.

The charging pile performs the charging preparation after receiving the first message, for example, to perform the pre-charging, and determine whether the output voltage is in the normal range, and so on. The charging pile sends the second message indicating that the charging pile is ready after it is ready, in order to let the BMS confirm that the charging pile is ready for outputting. The second message of the charging pile is first sent to the power conversion device.

Since the pre-charging process of the power conversion device may last for a long time, the pre-charging process of the power conversion device may not be completed when the power conversion device receives the second message sent by the charging pile. Optionally, in this case, the power conversion device may perform the following processing.

505, the power conversion device sends a suspend output message to the charging pile.

If the pre-charging is not completed, the power conversion device sends the suspend output message to the charging pile, and the suspend output message is configured to indicate that the charging pile suspends outputting charging power.

The charging pile sends the second message indicating that the charging pile is ready for outputting. In the case of the pre-charging of the power conversion device having not been completed, if the charging pile outputs the high voltage at this time, it may still cause the capacitor in the power conversion device to produce the large pulsed large current, which affects the normal charging process. Therefore, the power conversion device can cause the charging pile to suspend outputting by sending the suspend output message to the charging pile.

Optionally, the power conversion device may send the suspend output message to the charging pile in the following manners.

506, the power conversion device forwards the second message to the BMS.

507, the BMS sends a battery charging demand message.

The BMS confirms that the charging pile is ready for outputting after receiving the second message from the charging pile, thus the battery charging demand message is sent to the charging pile. The battery charging demand message includes charging requirements of the traction battery, such as, a demand voltage, a demand current and so on.

508, the power conversion device forwards the battery charging demand message to the charging pile.

In 505, the power conversion device sends the suspend output message to the charging pile. Optionally, the suspend output message may adopt a state information message of the traction battery, in which a charging permission field is set to "prohibited", thereby prohibiting the charging pile from outputting the charging power.

Optionally, the power conversion device may perform the following processing after the pre-charging is completed.

509, the power conversion device sends a permit output message to the charging pile.

If the pre-charging is completed, the power conversion device sends the permit output message to the charging pile, and the permit output message is configured to indicate that the charging pile outputs the charging power.

After the pre-charging is completed, a normal charging can be performed, and the charging pile can be permitted to output normally at this time. Optionally, the permit output message may adopt the state information message of the traction battery, in which the charging permission field is set to "permitted", thereby permitting the charging pile to output the charging power.

In the embodiments of the present application, when the pre-charging of the power conversion device has not been completed, the power conversion device causes the charging pile to suspend outputting by sending the suspend output message to the charging pile, in order to avoid the high voltage output from the charging pile causing the capacitor in the power conversion equipment to produce the large pulsed current, so as to ensure the normal charging progress and the charging safety.

Figure 6:
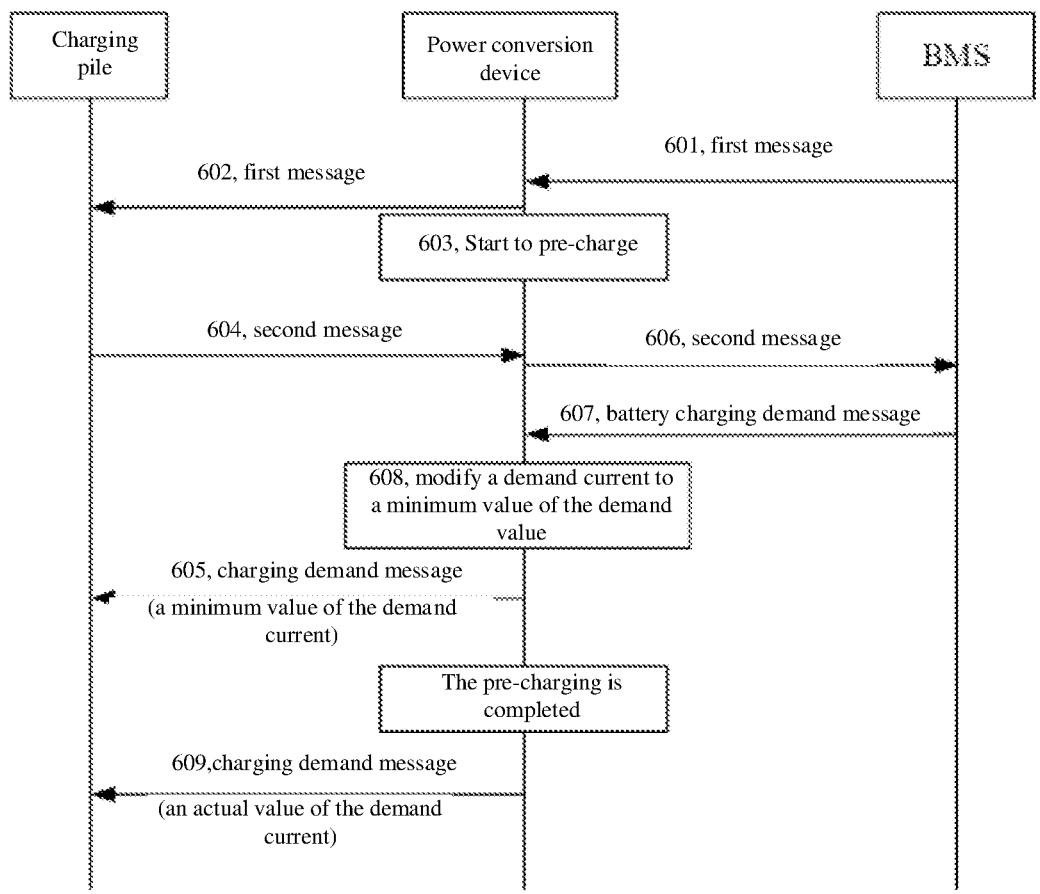
FIG. 6 is an interaction flowchart of the method for pre-charging according to another embodiment of the present application.

FIG. 6 shows an interaction flowchart of a method for pre-charging according to another embodiment of the present application. The power conversion device, the charging pile and the BMS in the FIG. 6 can be the power conversion device 110, the charging pile 120 and the BMS 130 in FIG. 1. Steps 501-504 in FIG. 6 are the same as steps 501-504 in FIG. 5, and relevant description of FIG .5 can be referred to. For brevity, details are not described herein again.

605, the power conversion device sends a charging demand message to the charging pile.

If the pre-charging is not completed, the power conversion device sends the charging demand message to the charging pile, the charging demand message carries a demand current value, and the demand current value is a minimum value of a demand current.

The charging pile sends the second message indicating that the charging pile is ready for outputting. In the case of the pre-charging of the power conversion device having not been completed, if the charging pile outputs a large current at this time, it may still cause the capacitor in the power conversion device to produce the large pulsed large current, which affects the normal charging process. Therefore, the power conversion device can cause the charging pile to output the current according to the minimum value of the demand current by sending the minimum value of the demand current to the charging pile. In this case, the current output by the charging pile is very small, so it cannot cause the capacitor in the power conversion device to produce the large pulsed current.

Optionally, the power conversion device may send the charging demand message to the charging pile in the following manners.

606, the power conversion device forwards the second message to the BMS.

607, the BMS sends the battery charging demand message.

The BMS confirms that the charging pile is ready for outputting after receiving the second message from the charging pile, thus the battery charging demand message is sent to the charging pile. The battery charging requirement message includes charging requirements of the traction battery, such as, a demand voltage, a demand current and so on.

608, the power conversion device amends the demand current in the battery charging demand message sent by the BMS to the minimum value of the demand current to obtain the new charging demand message.

For example, the minimum value of the demand current may be zero, but this is not limited in the embodiments of the present application.

In 605, the power conversion device sends the charging demand message to the charging pile. The value of the demand current in the charging demand message is the minimum value of the demand current, so that the charging pile outputs the current according to the minimum value of the demand current.

Optionally, the power conversion device may perform the following processing after the pre-charging is completed.

609, the power conversion device sends the charging demand message to the charging pile.

If the pre-charging is completed, the power conversion device sends the charging demand message to the charging pile, the charging demand message carries the demand current value, and the demand current value is an actual value of the current demand current.

After the pre-charging is completed, the normal charging can be performed, and the demand current value in the charging demand message sent to the charging pile is the actual value of the current demand current. That is, in this case, the power conversion device can directly forward the battery charging demand message sent by the BMS to the charging pile without an amendment.

In the embodiments of the present application, when the pre-charging of the power conversion device has not been completed, the power conversion device causes the charging pile to output the current according to the minimum value of the demand current by sending the minimum value of the demand current to the charging pile, in order to avoid a high current output from the charging pile causing the capacitor in the power conversion device to produce the large pulsed current, so as to ensure the normal charging process and the charging safety.

The above respectively describes two processes, that is, the power conversion device and the charging pile perform the pre-charging one after another, and the power conversion device and the charging pile perform the pre-charging at the same time. The specific operation of the power conversion device during the pre-charging process will be described below.

In addition to the aforementioned interaction between the power conversion device and BMS, the power conversion device may also detect a state of the power conversion device during the pre-charging.

Optionally, in one embodiment of the present application, when the power conversion device determines that the power conversion device is in a normal state, the pre-charging is performed.

Optionally, in one embodiment of the present application, the power conversion device detects the state of the power conversion device during the pre-charging process, and if the state of the power conversion device is a pre-charging abnormal state, the power conversion device performs an abnormal processing. For example, abnormal states of the pre-charging may include: pre-charging failure, pre-charging overtime, failure to enter the pre-charging, and so on.

Optionally, in one embodiment of the present application, the power conversion device ends the pre-charging after determining that the pre-charging is completed. If the pre-charging is performed normally, the power conversion device ends the pre-charging after determining that the pre-charging is completed.

The following describes the pre-charging process of the power conversion device by taking the power conversion device including the control unit and the power unit as an example. For example, the power conversion device can be the power conversion device 110 in FIG. 1, including the control unit 111 and the power unit 112.

Figure 7:
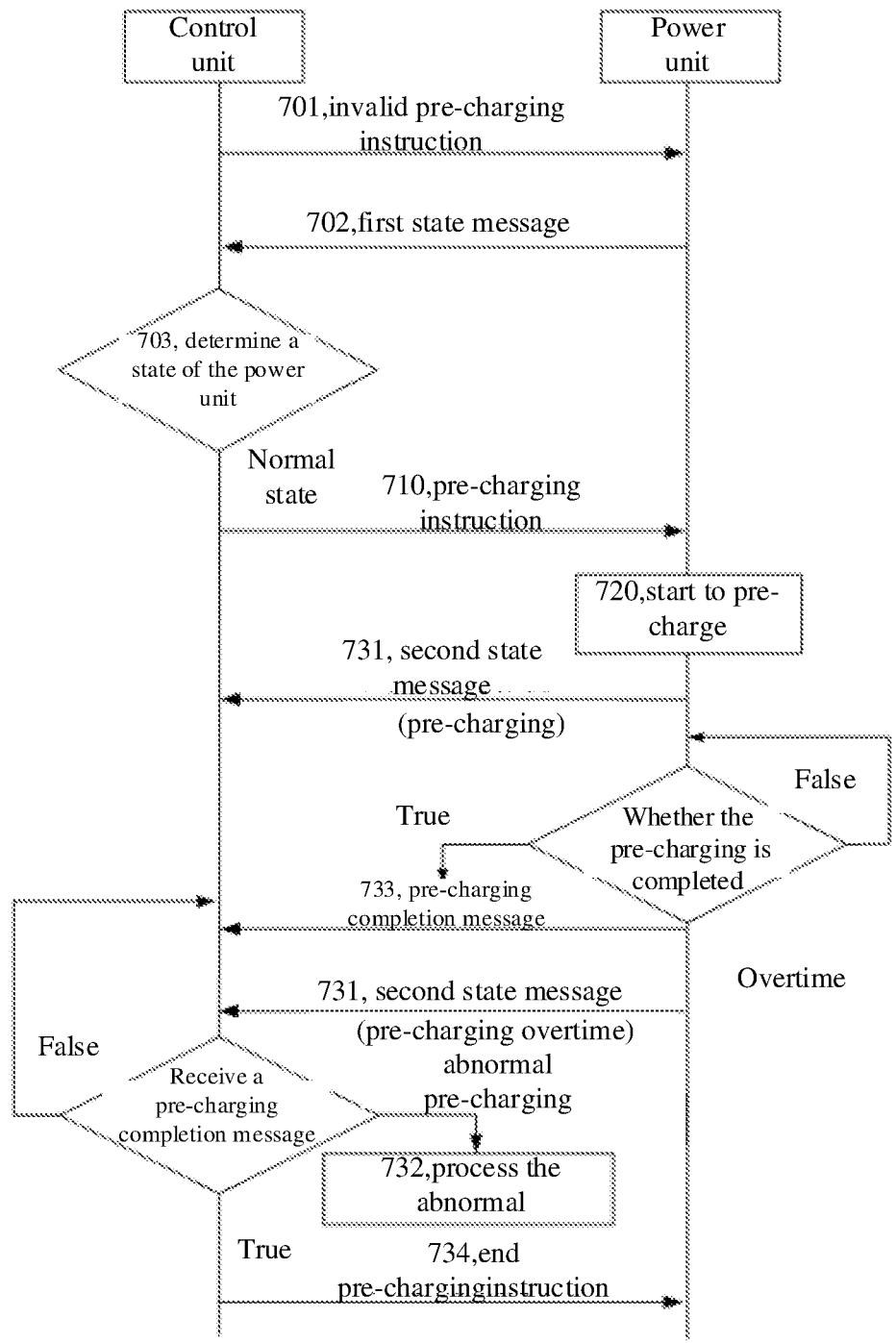
FIG. 7 is a schematic flowchart of the method for pre-charging the power conversion device according to another embodiment of the present application.

FIG. 7 shows a schematic flowchart of a method for pre-charging a power conversion device according to an embodiment of the present application. The power conversion device is configured to perform the power conversion between the charging pile and the traction battery, and the power conversion device includes: the control unit and the power unit.

710, the control unit sends a pre-charging instruction to the power unit when the power unit is in the normal state.

720, the power unit starts to pre-charge according to the pre-charging instruction, and the pre-charging includes: charging the capacitor in the power conversion device.

Specifically, the control unit controls the power unit to perform the pre-charging of the power conversion device. The control unit sends the pre-charging instruction to the power unit when confirming that the power unit is in the normal state, so as to start the pre-charging. The power unit waits for the pre-charging instruction, and starts to pre-charge when receiving the pre-charging instruction.

Optionally, as shown in FIG. 7, the control unit may determine the state of the power unit in the following manners.

701, the control unit sends an invalid pre-charging instruction to the power unit before sending the pre-charging instruction to the power unit.

The invalid pre-charging instruction is used to trigger the power unit to detect the state of the power unit.

702, the power unit sends a first state message to the control unit in response to the invalid pre-charging instruction, and the first state message carries the state of the power unit.

The power unit starts to work, detects the current state of the power unit, and sends the state of the power unit to the control unit through the first state message after receiving the invalid pre-charging instruction.

For example, the state of the power unit in the first state message can be expressed as: 0 initialization; 1 normal state; 2 fault state; 3 invalid state. 0 initialization state indicates that it is being initialized and needs to wait; 1 normal state indicates that the power unit can be pre-charged; 2 fault state indicates that there is a fault; 3 invalid state indicates that it cannot be pre-charged.

703, the control unit determines the state of the power unit according to the first state message.

For example, when the state of the power unit in the first state message is 1 normal state, it indicates that it can be pre-charged, and the control unit sends the pre-charging instruction to the power unit in 710. When the state of the power unit is 0 initialization state, the control unit will wait until the state of the power unit is 1 normal state. When the state of the power unit is 2 fault state, the control unit will enter a corresponding fault handling mode and stop to pre-charge. When the state of the power unit is 3 invalid state, the pre-charging cannot be performed, and the control unit will also enter the corresponding fault handling mode and stop to pre-charge.

Optionally, as shown in FIG. 7, the power unit and the control unit may also perform the following operations after the pre-charging is started.

731, the power unit detects the state of the power unit and sends a second state message to the control unit, and the second state message carries the state of the power unit.

During the pre-charging process, the power unit continuously detects its own state, and sends it to the control unit through the second state message. For example, the state of the power unit in the second state message may include: 0 not entering the pre-charging; 1 pre-charging; 2 pre-charging overtime; 3 pre-charging fault; 4 pre-charging success. 0 not entering the pre-charging indicates that it has not entered the pre-charging state; 1 pre-charging indicates that it has entered the pre-charging state; 2 pre-charging overtime indicates that the pre-charging has not been completed within predetermined time (e.g. 5 seconds) after receiving the pre-charging instruction; 3 pre-charging fault indicates that the pre-charging is faulty; 4 pre-charging success indicates that the pre-charging has been completed within the predetermined time (e.g. 5 seconds) after receiving the pre-charging instruction.

732, the control unit performs the abnormal processing when the power unit is in a pre-charging abnormal state.

Abnormal states of the pre-charging may include not entering the pre-charging, pre-charging overtime, pre-charging fault and so on. In this case, the control unit performs the abnormal processing.

733, the power unit sends a pre-charging completion message to the control unit after the pre-charging is completed.

The pre-charging completion message may be one of the above second state messages, that is, the second state message indicates that the pre-charging is successful.

734, the control unit sends an end pre-charging instruction to the power unit according to the pre-charging completion message. At this point, the pre-charging process is over.

In the embodiments of the present application, the control unit controls the power unit to perform the pre-charging according to the state of the power unit, so as to charge the capacitor in the power conversion device. In this way, the capacitor will not cause the large pulsed current in the subsequent charging process of the traction battery, which can ensure the normal charging progress and the charging safety.

Optionally, in the case where the power conversion device includes the control unit and the power unit, the control unit is responsible for the interaction between the charging pile and BMS. That is, the control unit can also perform the following operations.

Optionally, in one embodiment of the present application, before the control unit sends the pre-charging instruction to the power unit, the control unit receives the first message sent by the battery management system of the traction battery, and the first message is configured to indicate that the battery management system is ready for charging.

Optionally, in one embodiment of the present application, the control unit forwards the first message to the charging pile after the pre-charging is completed; the control unit receives the second message sent by the charging pile, and the second message is configured to indicate that the charging pile is ready for charging; and the control unit forwards the second message to the battery management system.

Optionally, in one embodiment of the present application, the control unit forwards the first message to the charging pile; the control unit receives the second message sent by the charging pile, and the second message is configured to indicate that the charging pile is ready for charging; and if the pre-charging is not completed, the control unit sends the suspend output message to the charging pile, and the suspend output message is configured to indicate that the charging pile suspends outputting the charging power.

Optionally, in one embodiment of the present application, the control unit forwards the first message to the charging pile; the control unit receives the second message sent by the charging pile, and the second message is configured to indicate that the charging pile is ready for charging; and if the pre-charging is not completed, the control unit sends the charging demand message to the charging pile, the charging demand message carries the demand current value, and the demand current value is the minimum value of the demand current.

The method for pre-charging the power conversion device in the embodiments of the present application is described above, and the power conversion device in the embodiments of the present application is described below. It should be understood that the relevant description in the following embodiments may refer to the foregoing embodiments. For brevity, details are not described again.

Figure 8:
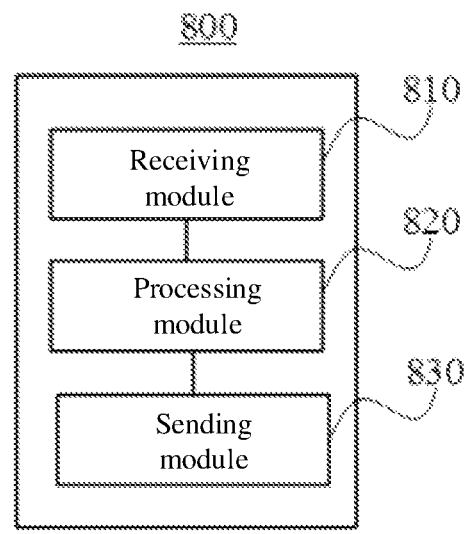
FIG. 8 is a schematic block diagram of a power conversion device according to an embodiment of the present application.

FIG. 8 shows a schematic block diagram of a power conversion device 800 according to one embodiment of the present application. As shown in FIG. 8, the power conversion device 800 includes: a receiving module 810, a sending module 820, and a processing module 830.

In one embodiment of the present application, the receiving module 810 is configured to receive the first message sent by the battery management system of the traction battery, and the first message is configured to indicate that the battery management system is ready for charging; the processing module 830 is configured to perform the pre-charging, and the pre-charging includes: charging the capacitor in the power conversion device; and the sending module 820 is configured to forward the first message to the charging pile after the pre-charging is completed.

Optionally, the receiving module 810 is further configured to receive the second message sent by the charging pile, and the second message is configured to indicate that the charging pile is ready for charging; and the sending module 820 is further configured to forward the second message to the battery management system.

Optionally, the processing module 830 is configured to perform the pre-charging when determining that the power conversion device is in the normal state.

Optionally, the processing module 830 is configured to detect the state of the power conversion device during the pre-charging process, and if the state of the power conversion device is the pre-charging abnormal state, the abnormal processing is performed.

Optionally, the processing module 830 is configure to end the pre-charging after determining the pre-charging is completed.

In another embodiment of the present application, the receiving module 810 is configured to receive the first message sent by the battery management system of the traction battery, and the first message is configured to indicate that the battery management system is ready for charging; the sending module 820 is configured to forward the first message to the charging pile; the processing module 830 is configured to perform the pre-charging, and the pre-charging includes: charging the capacitor in the power conversion device.

Optionally, the receiving module 810 is further configured to receive the second message sent by the charging pile, and the second message is configured to indicate that the charging pile is ready for charging; and the sending module 820 is further configured, if the pre-charging is not completed, to send the suspend output message to the charging pile, and the suspend output message is configured to indicate that the charging pile suspends outputting charging power.

Optionally, the sending module 820 is further configured, if the pre-charging is completed, to send the permit output message to the charging pile, and the permit output message is configured to indicate that the charging pile outputs the charging power.

Optionally, the receiving module 810 is further configured to receive the second message sent by the charging pile, and the second message is configured to indicate that the charging pile is ready for charging; and the sending module 820 is further configure, if the pre-charging is not completed, to send the charging demand message to the charging pile, the charging demand message carries the demand current value, and the demand current value is the minimum value of the demand current.

Optionally, the sending module 820 is further configure, if the pre-charging is completed, to send the charging demand message to the charging pile, the charging demand message carries the demand current value, and the demand current value is the actual value of the current demand current.

Optionally, the processing module 830 is configured to perform the pre-charging when determining that the power conversion device is in the normal state.

Optionally, the processing module 830 is configured to detect the state of the power conversion device during the pre-charging process, and if the state of the power conversion device is the pre-charging abnormal state, the abnormal processing is performed.

Optionally, the processing module 830 is configure to end the pre-charging after determining the pre-charging is completed.

Figure 9:
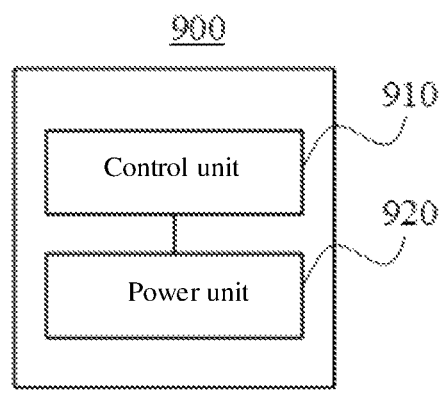
FIG. 9 is a schematic block diagram of a power conversion device according to another embodiment of the present application.

FIG. 9 shows a schematic block diagram of a power conversion device 900 according to another embodiment of the present application. As shown in FIG. 9, the power conversion device 900 includes: a control unit 910 and a power unit 920.

The control unit 910 is configured to send the pre-charging instruction to the power unit 920 when the power unit 920 is in the normal state; the power unit 920 is configured to start to pre-charge according to the pre-charging instruction, and the pre-charging includes: charging the capacitor in the power conversion device 920.

Optionally, the control unit 910 is further configured to send the invalid pre-charging instruction to the power unit 920 before sending the pre-charging instruction to the power unit 920; the power unit 920 is further configured to send the first state message to the control unit 910 in response to the invalid pre-charging instruction, and the first state message carries the state of the power unit 920; and the control unit 910 is further configured to determine the state of the power unit 920 according to the first state message.

Optionally, the power unit 920 is further configured to detect the state of the power unit 920 and send the second state message to the control unit 910 after starting the pre-charging, and the second state message carries the state of the power unit 920.

Optionally, the control unit 910 is further configured to perform the abnormal processing when the power unit 920 is in the pre-charging abnormal state.

Optionally, the power unit 920 is further configure to send the pre-charging completion message to the control unit 910 after the pre-charging is completed; the control unit 910 is further configured to send the end pre-charging instruction to the power unit 920 according to the pre-charging completion message.

Optionally, the control unit 910 is further configured to, before the control unit sends the pre-charging instruction to the power unit 920, receive the first message sent by the battery management system of the traction battery, and the first message is configured to indicate that the battery management system is ready for charging.

Optionally, the control unit 910 is further configured to forward the first message to the charging pile after the pre-charging is completed; receive the second message sent by the charging pile, and the second message is configured to indicate that the charging pile is ready for charging; and forward the second message to the battery management system.

Optionally, the control unit 910 is further configured to forward the first message to the charging pile; receive the second message sent by the charging pile, and the second message is configured to indicate that the charging pile is ready for charging; and if the pre-charging is not completed, send the suspend output message to the charging pile, and the suspend output message is configured to indicate that the charging pile suspends outputting charging power.

Optionally, the control unit 910 is further configured to forward the first message to the charging pile; receive the second message sent by the charging pile, and the second message is configured to indicate that the charging pile is ready for charging; and if the pre-charging is not completed, send the charging demand message to the charging pile, the charging demand message carries the demand current value, and the demand current value is the minimum value of the demand current.

The embodiments of the present application further provides the charging pile and BMS, and the charging pile and BMS are respectively used to perform corresponding operations in the methods of the embodiments of the present application. Specifically, the charging pile and BMS may respectively include modules for performing corresponding operations in the methods of the above embodiments of the present application.

Figure 10:
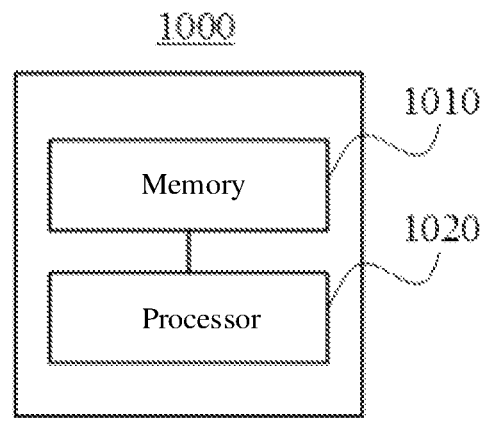
FIG. 10 is a schematic block diagram of the power conversion device according to another embodiment of the present application.

FIG. 10 shows a schematic block diagram of a device 1000 according to another embodiment of the present application. The device 1000 may be a power conversion device, a charging pile or a BMS. As shown in FIG. 10, the device 1000 includes a memory 1010 and a processor 1020, where the memory 1010 is configured to store an instruction, and the processor 1020 is configured to read the instruction and perform the above methods of the embodiments of the present application based on the instruction.

The embodiments of the present application further provides a readable storage medium to store a computer program, and the computer program is used to perform the above methods of the embodiments of the present application.

Although the present application has been described with reference to the embodiments thereof, various modifications can be made thereto without departing from the scope of the present application, and the components therein can be replaced with equivalents. In particular, the technical features mentioned in each embodiments can be combined in any manner, as long as there is no structural conflict. The present application is not limited to the specific embodiments disclosed herein, but includes all technical solutions falling within the scope of the claims.

What is claimed is:

1. A method for pre-charging a power conversion device, wherein the power conversion device is configured to perform power conversion between a charging pile and a traction battery, and the method comprises:
   receiving, by the power conversion device, a first message sent by a battery management system of the traction battery, and the first message is configured to indicate that the battery management system is ready for charging;
   performing, by the power conversion device, a pre-charging, and the pre-charging comprises: charging a capacitor in the power conversion device; and
   forwarding, by the power conversion device, the first message to the charging pile after the pre-charging is completed;
   the power conversion equipment is connected between the charging pile and a power consumption device, and the power consumption device comprises the traction battery.

2. The method according to claim 1, wherein the method further comprises:
   receiving, by the power conversion device, a second message sent by the charging pile, and the second message is configured to indicate that the charging pile is ready for charging; and
   forwarding, by the power conversion device, the second message to the battery management system.

3. The method according to claim 1, wherein performing, by the power conversion device, the pre-charging, comprising:
   when the power conversion device determines that the power conversion device is in a normal state, the pre-charging is performed.

4. The method according to claim 3, wherein the method further comprises:
   the power conversion device detects a state of the power conversion device during a process of the pre-charging, and under the condition that the state of the power conversion device is in an abnormal pre-charging state, performing, by the power conversion device, an abnormal processing.

5. The method according to claim 1, wherein the method further comprises:
   ending, by the power conversion device, the pre-charging after determining that the pre-charging is completed.

6. A power conversion device, wherein the power conversion device is configured to perform power conversion between a charging pile and a traction battery, and the power conversion device comprises:
   a receiving module configured to receive a first message sent by a battery management system of the traction battery, and the first message is configured to indicate that the battery management system is ready for charging;
   a processing module configured to perform a pre-charging, and the pre-charging comprises: charging a capacitor in the power conversion device; and
   a sending module configured to forward the first message to the charging pile after the pre-charging is completed;
   the power conversion equipment is connected between the charging pile and a power consumption device, and the power consumption device comprises the traction battery.

7. The power conversion device according to claim 6, wherein the receiving module is further configured to receive a second message sent by the charging pile, and the second message is configured to indicate that the charging pile is ready for charging; and
   the sending module is further configured to forward the second message to the battery management system.

8. The power conversion device according to claim 6, wherein the processing module is configured to perform the pre-charging when determining that the power conversion device is in a normal state.

9. The power conversion device according to claim 8, wherein the processing module is configured to detect a state of the power conversion device during a process of the pre-charging, and under the condition that the state of the power conversion device is in an abnormal pre-charging state, an abnormal processing is performed.

10. The power conversion device according to claim 6, wherein the processing module is configured to end the pre-charging after determining that the pre-charging is completed.

11. A power conversion device, wherein the power conversion device is configured to perform power conversion between a charging pile and a traction battery, and the power conversion device comprises: a control unit and a power unit;
   the control unit is configured to send a pre-charging instruction to the power unit when the power unit is in a normal state; and
   the power unit is configured to start to pre-charge according to the pre-charging instruction, and the pre-charging comprises: charging a capacitor in the power conversion device;
   the power conversion equipment is connected between the charging pile and a power consumption device, and the power consumption device comprises the traction battery.

12. The power conversion device according to claim 11, wherein the control unit is further configured to send an invalid pre-charging instruction to the power unit before sending the pre-charging instruction to the power unit;
   the power unit is further configured to send a first state message to the control unit in response to the invalid pre-charging instruction, and the first state message carries a state of the power unit; and
   the control unit is further configured to determine the state of the power unit according to the first state message.

13. The power conversion device according to claim 11, wherein the power unit is further configured to detect a state of the power unit and send a second state message to the control unit after starting the pre-charging, and the second state message carries the state of the power unit.

14. The power conversion device according to claim 13, wherein the control unit is further configured to perform an abnormal processing when the power unit is in an abnormal pre-charging state.

15. The power conversion device according to claim 11, wherein the power unit is further configured to send a pre-charging completion message to the control unit after the pre-charging is completed; and
   the control unit is further configured to send an end pre-charging instruction to the power unit according to the pre-charging completion message.

16. The power conversion device according to claim 11, wherein the control unit is further configured to receive a first message sent by a battery management system of the traction battery before sending the pre-charging instruction to the power unit, and the first message is configured to indicate that the battery management system is ready for charging.

17. The power conversion device according to claim 16, wherein the control unit is further configured to forward the first message to the charging pile after the pre-charging is completed; receive a second message sent by the charging pile, and the second message is configured to indicate that the charging pile is ready for charging; and forward the second message to the battery management system.

18. The power conversion device according to claim 16, wherein the control unit is further configured to forward the first message to the charging pile; receive a second message sent by the charging pile, and the second message is configured to indicate that the charging pile is ready for charging; and under the condition that the pre-charging is not completed, a suspend output message is sent to the charging pile, and the suspend output message is configured to indicate that the charging pile suspends outputting charging power.

19. The power conversion device according to claim 16, wherein the control unit is further configured to forward the first message to the charging pile; receive a second message sent by the charging pile, and the second message is configured to indicate that the charging pile is ready for charging; and under the condition that the pre-charging is not completed, a charging demand message is sent to the charging pile, the charging demand message carries a demand current value, and the demand current value is a minimum value of a demand current.

\* \* \* \* \*